(12) United States Patent
Van Oosten et al.

(10) Patent No.: US 10,054,862 B2
(45) Date of Patent: Aug. 21, 2018

(54) INSPECTION APPARATUS, INSPECTION METHOD, LITHOGRAPHIC APPARATUS, PATTERNING DEVICE AND MANUFACTURING METHOD

(71) Applicant: ASML Netherlands B.V., Veldhoven (NL)

(72) Inventors: Anton Bernhard Van Oosten, Lommel (BE); Paul Christiaan Hinnen, Veldhoven (NL); Robertus Cornelis Martinus De Kruif, Eindhoven (NL); Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/179,509

(22) Filed: Jun. 10, 2016

(65) Prior Publication Data
US 2016/0363871 A1 Dec. 15, 2016

(30) Foreign Application Priority Data
Jun. 12, 2015 (EP) .................................. 15171970

(51) Int. Cl.
*G03F 7/20* (2006.01)
*G03F 1/44* (2012.01)

(52) U.S. Cl.
CPC ............ *G03F 7/70558* (2013.01); *G03F 1/44* (2013.01); *G03F 7/70516* (2013.01);
(Continued)

(58) Field of Classification Search
CPC . G03F 7/70641; G03F 7/70558; G03F 9/7026
See application file for complete search history.

(56) References Cited

U.S. PATENT DOCUMENTS 6,376,139 B1 * 4/2002 Fujisawa ............. G03F 7/70625
430/30
6,414,326 B1 * 7/2002 Nguyen ............. G03F 7/70558
250/492.2
(Continued)

FOREIGN PATENT DOCUMENTS

DE 102005009554 9/2006
WO WO 2013/178422 A1 12/2013
WO WO 2015/090839 A1 6/2015

OTHER PUBLICATIONS

Partial International Search Report directed to related International Patent Application No. PCT/EP2016/062259, dated Sep. 20, 2016; 8 pages.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

Disclosed is a method of monitoring a focus parameter during a lithographic process. The method comprises acquiring first and second measurements of, respectively first and second targets, wherein the first and second targets have been exposed with a relative best focus offset. The method then comprises determining the focus parameter from first and second measurements. Also disclosed are corresponding measurement and lithographic apparatuses, a computer program and a method of manufacturing devices.

19 Claims, 8 Drawing Sheets

(52) U.S. Cl.
CPC ...... *G03F 7/70525* (2013.01); *G03F 7/70625* (2013.01); *G03F 7/70641* (2013.01)

(56) References Cited

U.S. PATENT DOCUMENTS

| | | | |
|---|---|---|---|
| 6,429,930 | B1 | 8/2002 | Littau et al. |
| 6,440,616 | B1 | 8/2002 | Izuha et al. |
| 6,606,152 | B2 | 8/2003 | Littau et al. |
| 7,119,893 | B2 | 10/2006 | Littau et al. |
| 7,598,007 | B2 | 10/2009 | Yamamoto |
| 8,208,122 | B2 | 6/2012 | Staals et al. |
| 2005/0084782 | A1* | 4/2005 | Sentoku ............ G03F 7/705 430/30 |
| 2005/0277035 | A1* | 12/2005 | Yamamoto .......... G03F 7/70641 430/30 |
| 2006/0024850 | A1 | 2/2006 | Monahan et al. |
| 2006/0033921 | A1 | 2/2006 | Den Boef et al. |
| 2006/0066855 | A1 | 3/2006 | Den Boef et al. |
| 2006/0234137 | A1 | 11/2006 | Kim |
| 2009/0268182 | A1* | 10/2009 | Staals ................. G03B 27/32 355/53 |
| 2009/0284722 | A1* | 11/2009 | Gabor ................ G03F 7/70333 355/53 |
| 2010/0201963 | A1 | 8/2010 | Cramer et al. |
| 2010/0328655 | A1 | 12/2010 | Den Boef et al. |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2013/0050668 | A1* | 2/2013 | Kisteman ............ G03F 7/70641 355/55 |
| 2013/0189724 | A1 | 7/2013 | Meehan et al. |
| 2013/0258301 | A1 | 10/2013 | Dehe |
| 2013/0258310 | A1 | 10/2013 | Smilde et al. |
| 2013/0271740 | A1 | 10/2013 | Quintanilha |
| 2014/0141536 | A1 | 5/2014 | Levinski et al. |

OTHER PUBLICATIONS

Yamamoto et al. "In-Line-Focus Monitoring Technique Using Lens Aberration Effect," SPIE, vol. 5752, 2005; 8 pages.

English-Language Abstract for Dutch Patent Publication No. DE 10 2005 009 554, published Sep. 21, 2006; 1 page.

Krautschik et al., "The Impact of the EUV mask Phase Response on the Asymmetry of Bossung Curves as Predicted by Rigorous EUV Mask Simulations," Association of Super Advanced Electronics Technology, SPIE 4343, 392, 2001; 10 pages.

Yang P., "Understanding Bossung Curve Asymmetry and Focus Shift Effect in EUV Lithography," Intel Corporation, SPIE 4562, 279, 2002; 9 pages.

International Search Report and Written Opinion of the International Search Authority directed to related International Patent Application No. PCT/EP2016/062259, dated Nov. 11, 2016; 14 pages.

Office Action related to U.S. Appl. No. 15/791,703, dated Jul. 3, 2018, 9 pages.

* cited by examiner

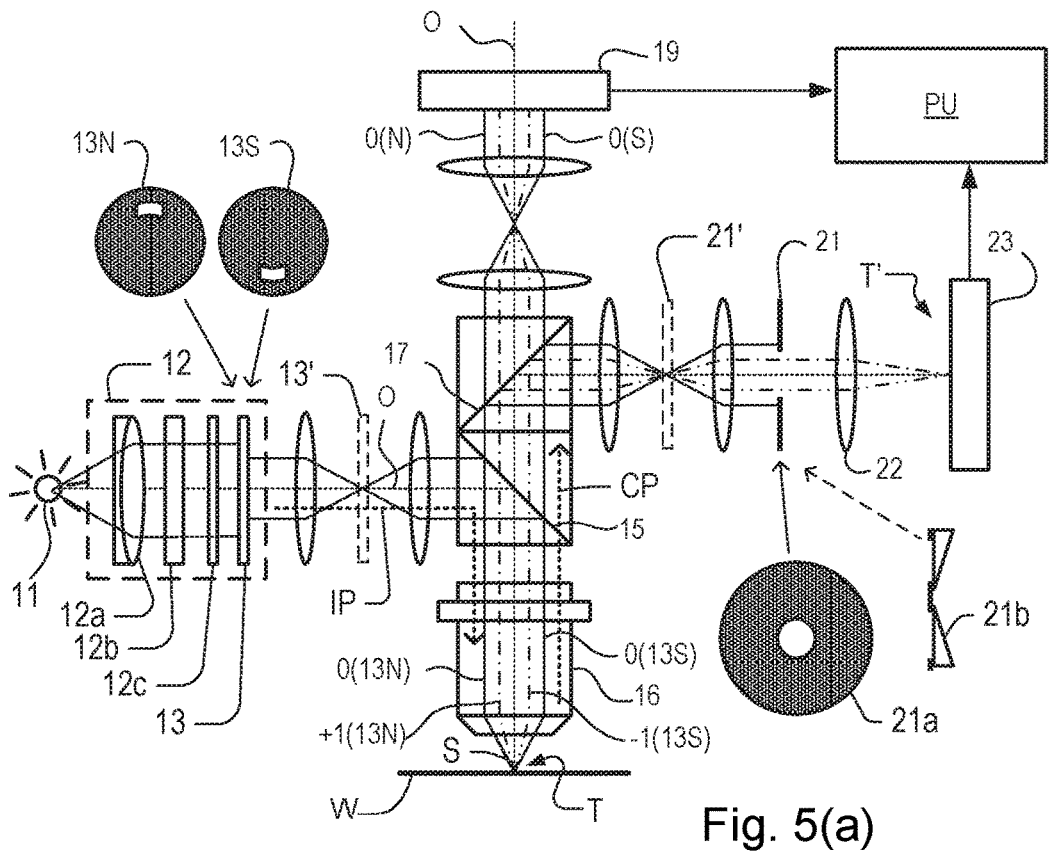
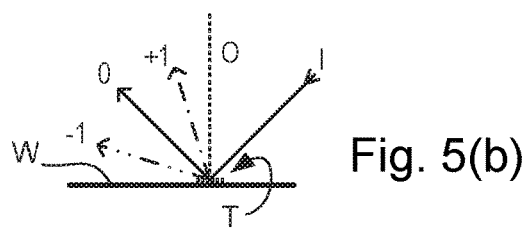
Fig. 5(a)
Fig. 5(b)
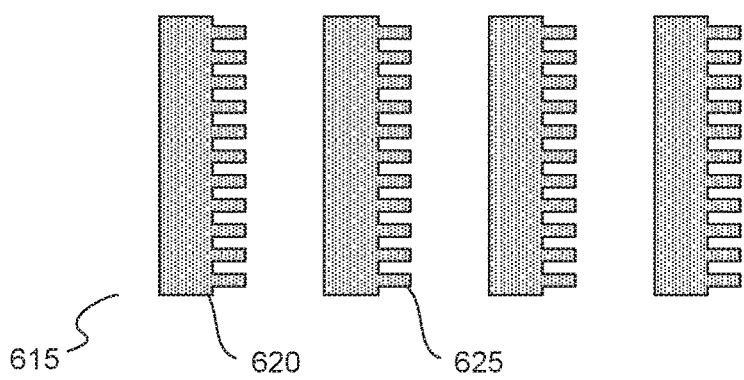
Fig. 6

INSPECTION APPARATUS, INSPECTION METHOD, LITHOGRAPHIC APPARATUS, PATTERNING DEVICE AND MANUFACTURING METHOD

BACKGROUND

Field of the Invention

The present invention relates to inspection apparatus and methods usable, for example, to perform metrology in the manufacture of devices by lithographic techniques. The invention further relates to such methods for monitoring a focus and/or dose parameter in a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature. Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy settings were determined from examination of those test structures.

Current test structure designs and focus measuring methods have a number of drawbacks. Many test structures require subresolution features or grating structures with large pitches. Such structures may contravene design rules of the users of lithographic apparatuses. Focus measuring techniques may comprise measuring asymmetry in opposite higher (e.g., first) order radiation scattered by special, focus dependent, target structures and determining focus from this asymmetry. For EUV lithography, resist thickness, and therefore the thickness of target structures, is smaller (for example, half as thick). Therefore focus sensitivity and signal strength may be insufficient to use such asymmetry methods in EUV lithography. In addition, asymmetry based techniques may require careful selection of target geometries to ensure a desired relationship (e.g., linear) between asymmetry and focus. This selection process can be complex and require significant effort to find a suitable target geometry. It may even be the case that no suitable target geometry exists.

SUMMARY OF THE INVENTION

The present invention aims to address one or more of the above identified drawbacks.

The invention in a first aspect provides method of monitoring a focus parameter during a lithographic process, said method comprising:

acquiring a first measurement value, said first measurement value having been obtained from inspection of a first target;

acquiring a second measurement value, said second measurement value having been obtained from inspection of a second target, wherein said first target and second target have been exposed with a relative best focus offset;

determining the focus parameter from said first measurement value and said second measurement value.

The invention yet further provides a method of manufacturing devices wherein a device pattern is applied to a series of substrates using a lithographic process, the method including:

using the method of the first aspect to monitor said focus parameter, and controlling the lithographic process for later substrates in accordance with the determined focus parameter.

The invention yet further provides a computer program product comprising machine-readable instructions for causing a processor to perform the method of the first aspect.

The invention yet further provides a patterning device configured to pattern a beam of radiation in a lithographic process according to a desired pattern, said patterning device comprising first features for forming a first target on substrate during the lithographic process, and second features for forming a second target on substrate during the lithographic process; wherein said second features are taller than said first features, in a direction transverse to the plane of the target and such that said first target and said second target have a relative best focus offset.

The invention yet further provides a method of monitoring a dose parameter during a lithographic process, said method comprising: acquiring a first measurement value, said first measurement value having been obtained from inspection of a first target; acquiring a second measurement value, said second measurement value having been obtained from inspection of a second target, determining the dose parameter from said first measurement value and said second measurement value; wherein said first and second targets comprise corresponding line and space targets having the same pitch and inverse duty cycles.

The invention yet further provides a method of manufacturing devices wherein a device pattern is applied to a series of substrates using a lithographic process, the method including: using the method of the aspect immediately above to monitor said dose parameter, and controlling the lithographic process for later substrates in accordance with the determined dose parameter.

The invention yet further provides a patterning device configured to pattern a beam of radiation in a lithographic process according to a desired pattern, said patterning device comprising first features for forming a first target on a substrate during the lithographic process, and second features for forming a second target on the substrate during the lithographic process; wherein said first features are configured to form said first target with line features having a substantially focus independent side wall angle and said second features are configured to form said second target with line features having a focus dependent side wall angle.

The invention yet further provides a patterning device configured to pattern a beam of radiation in a lithographic process according to a desired pattern, said patterning device comprising first features for forming a first target on a substrate during the lithographic process, and second features for forming a second target on a substrate during the lithographic process; wherein design rules constrain target features to a set critical dimension and on a grid of set pitch, wherein said first target and said second target are each formed from rows of said grids such that each of said first features and said second features are formed from one, or plural adjacent, corresponding target features formed on said grids.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5(a) to 5(b) illustrate schematically an inspection apparatus adapted to perform angle-resolved scatterometry and dark-field imaging inspection methods;

FIG. 6 illustrates target forming elements on a reticle suitable for forming a grating on a substrate having focus dependent asymmetry;

DETAILED DESCRIPTION OF EXEMPLARY EMBODIMENTS

Before describing embodiments of the invention in detail, it is instructive to present an example environment in which embodiments of the present invention may be implemented.

Figure 1:
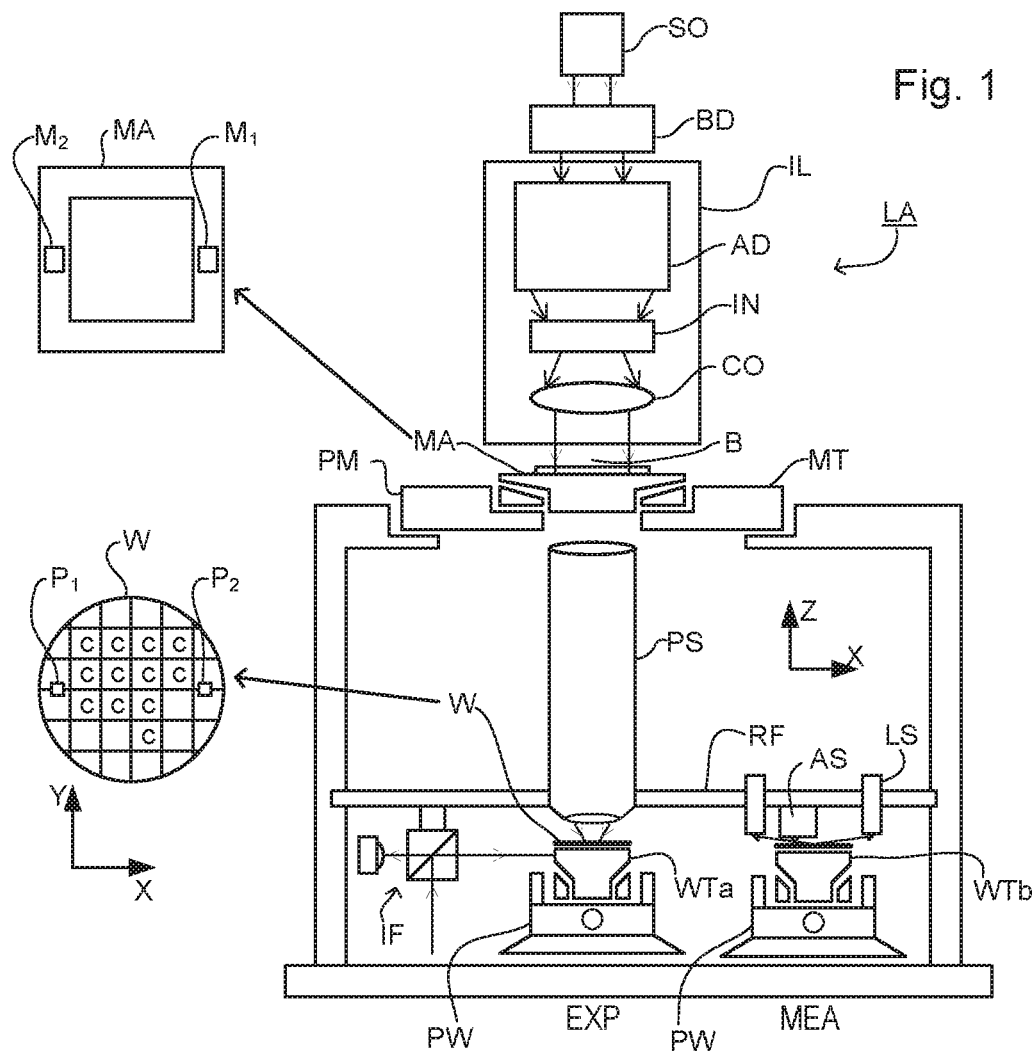
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms, The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
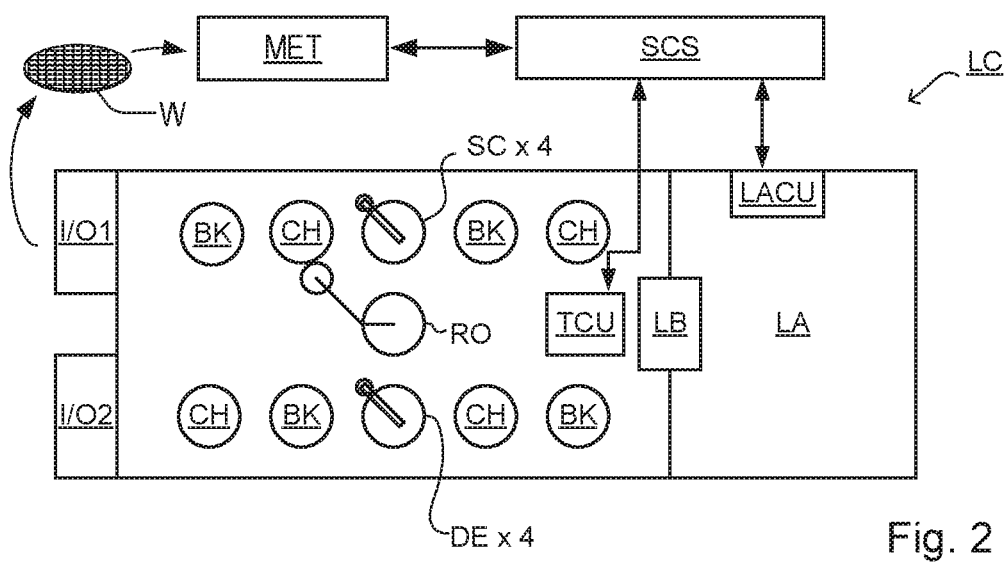
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
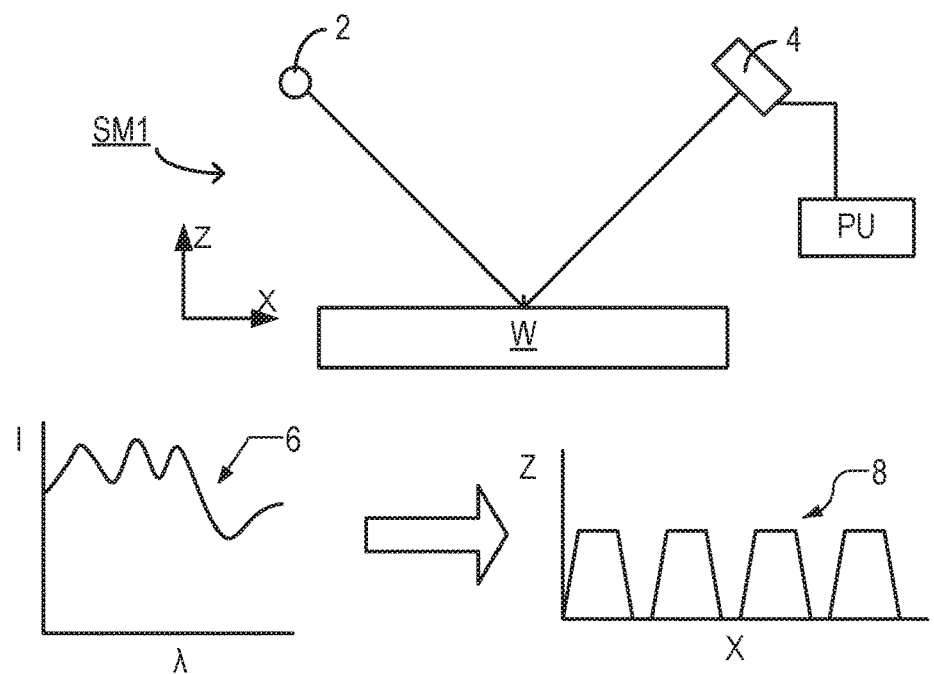
FIG. 3 illustrates the principles of operation of a spectroscopic scatterometer as a first example of an inspection apparatus.

FIG. 3 depicts a known spectroscopic scatterometer which may be used as an inspection apparatus in a metrology system of the type described above. It comprises a broadband (white light) radiation projector 2 which projects radiation onto a substrate W. The reflected radiation is passed to a spectrometer 4, which measures a spectrum 6 (intensity as a function of wavelength) of the specular reflected radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
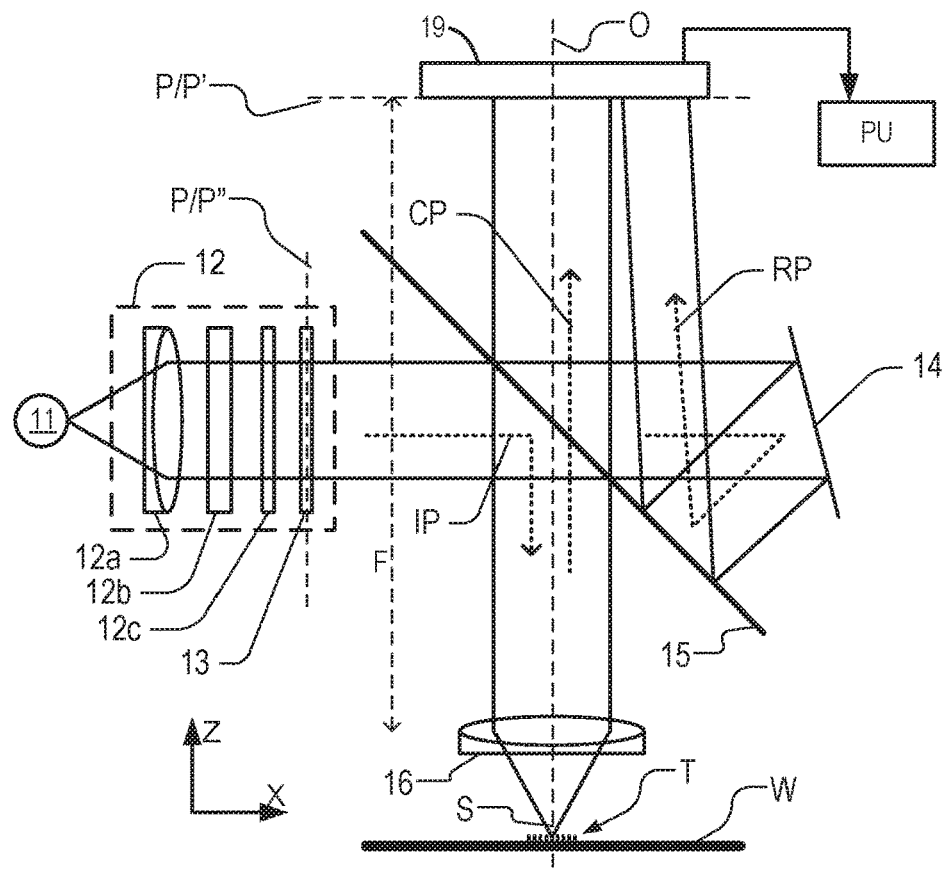
FIG. 4 illustrates in schematic form an angle-resolved scatterometer as another example of an inspection apparatus.

FIG. 4 shows the basic elements of a known angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating using lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system being brought to different locations on the substrate, when in practice the optical system remains substantially stationary and only the substrate moves. Provided the relative position of the substrate and the optical system is correct, it does not matter in principle whether one or both of those is moving in the real world.

When the radiation beam is incident on the beam splitter 16 part of it is transmitted through the beam splitter and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the back-projected pupil plane P, which is at the focal length F of the lens 16. In practice, the pupil plane itself may be inaccessible, and may instead be re-imaged with auxiliary optics (not shown) onto the detector located in a so-called conjugate pupil plane P'. The detector is preferably a two-dimensional detector so that a two-dimensional angular scatter spectrum or diffraction spectrum of a substrate target 30 can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

The various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P''' conjugate with pupil plane P of objective lens 16 and the plane of the detector 19. In this way, an illumination profile defined by the aperture device defines the angular distribution of light incident on substrate radiation passing through different locations on aperture device 13.

The detector 19 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

In addition to measurement of parameters by reconstruction, angle resolved scatterometry is useful in the measurement of asymmetry of features in product and/or resist patterns. A particular application of asymmetry measurement is for the measurement of a focus parameter (for example, the focus setting during exposure of the target) from targets which print with a focus dependent asymmetry. The concepts of asymmetry measurement using the instrument of FIG. 3 or 4 are described for example in published patent application US2006066855A1 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 4, where detector 19 may be an image sensor, such asymmetry in the diffraction orders appears directly as asymmetry in the pupil image recorded by detector 19. This asymmetry can be measured by digital image processing in unit PU, and from this, focus can be determined.

FIG. 5(a) shows in more detail an inspection apparatus implementing angle-resolved scatterometry by the same principles as the apparatus of FIG. 4, with additional adaptations for performing so-called dark field imaging. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating T and diffracted rays are illustrated in more detail in FIG. 5(b).

The same reference numbers are used for components described already in the FIG. 4 apparatus. The illumination path is labeled IP as before. The reference path RP is omitted, for clarity. Compared with that apparatus, a second beam splitter 17 divides the collection path into two branches. In a first measurement branch, detector 19 records a scatter spectrum or diffraction spectrum of the target exactly as described above. This detector 19 may be referred to as the pupil image detector.

In the second measurement branch, imaging optical system 22 forms an image of the target on the substrate W on sensor 23 (e.g. a CCD or CMOS sensor). An aperture stop 21 is provided in a plane that is in the collection path in a plane conjugate to the pupil-plane (it may also be called a pupil stop). Aperture stop 21 can take different forms, just as the illumination aperture can take different forms. Typically, aperture stop 21 functions to block the zeroth order diffracted beam so that the image of the target formed on sensor 23 is formed only from the first order beam(s). This is the so-called dark field image, equivalent to dark field microscopy. The images captured by sensors 19 and 23 are output to image processor and controller PU, the function of which will depend on the particular type of measurements being performed.

In the illumination path in this example, additional optics are shown such that a field stop 13' can be placed in a plane conjugate with the plane of the target and the image sensor 23. This plane may be referred to as a field plane, or conjugate image plane, and has the property that each spatial position across the field plane corresponds to a position across the target. This field stop may be used for example to shape the illumination spot for a particular purpose, or simply to avoid illuminating features that are within the field of view of the apparatus but not part of the target of interest. The following drawings and discussion refer, by way of example, to techniques for implementation of the function of aperture device 13, but the present disclosure also encompasses use of the same techniques to implement the function of field stop 13'.

As shown in more detail in FIG. 5(b), target grating T is placed with substrate W normal to the optical axis O of objective lens 16. In the case of an off-axis illumination profile, A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Different modes of illumination are possible by using different apertures. Apertures 13N (north') and 13S (south') each provide off-axis illumination from a specific narrow range of angles only. Returning to FIG. 5(a), this is illustrated by designating diametrically opposite portions of the annular aperture as north (N) and south (S). The +1 diffracted rays from the north portion of the cone of illumination, which are labeled +1(13N), enter the objective lens 16, and so do the −1 diffracted rays from the south portion of the cone (labeled −1(13S)). As described in the prior applications mentioned in the introduction, using the dark-field imaging sensor 23 while switching between apertures 13N, 13S of this type is one way of obtaining asymmetry measurements from multiple small targets. Aperture stop 21a can be used to block the zeroth order radiation when using off-axis illumination.

While off-axis illumination is shown, on-axis illumination of the targets may instead be used and an aperture stop with an off-axis aperture is used to pass substantially only one first order of diffracted light to the sensor. In one example, prisms 21b are used in place of aperture stop 21 which have the effect of diverting the +1 and −1 orders to different locations on sensor 23 so that they can be detected and compared without making two images. This technique, is disclosed in the above-mentioned published patent application US2011102753A1, the contents of which are hereby incorporated by reference. 2nd, 3rd and higher order beams (not shown in FIG. 5) can be used in measurements, instead of or in addition to the first order beams.

When monitoring a lithographic process, it is desirable to monitor focus of the lithography beam on the substrate. One known method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays 2nd order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also this method is sensitive to inter alia dose and process variation (crosstalk).

To address these issues, diffraction based focus (DBF) was devised. Diffraction based focus may use target forming features on the reticle which print targets having a degree of asymmetry which is dependent on the focus setting during printing. This degree of asymmetry can then be measured using a scatterometery based inspection method, for example by measuring the intensity asymmetry between the intensities of +1st and −1st order radiation diffracted from the target, to obtain a measure of the focus setting.

FIG. 6 illustrates DBF target forming design 615 configured for diffraction based focus measurements. It comprises plural DBF structures 620, each of which comprises high resolution substructures 625. The high resolution substructures 625 on top of a base pitch creates an asymmetric resist profile for each DBF structure 620, with the degree of asymmetry being dependent upon focus. Consequently a metrology tool can measure the degree of asymmetry from a target formed using DBF target forming design 615 and translate this into the scanner focus.

While the DBF target forming design 615 enables diffraction based focus measurements, it is not suitable for use in all situations. EUV resist film thicknesses are significantly lower than those used in immersion lithography, which makes it difficult to extract accurate asymmetry information from the asymmetric profile of the structures forming part of a target. In addition such structures may not comply with the strict design constraints applicable to certain product structures. During the chip making process all features on the reticle must print and stand up to subsequent processing steps. Semiconductor manufacturers use design rules as a means to restrict the feature designs to ensure the printed features conform to their process requirements. An example of such a design rule relates to the allowable size of structures or pitches. Another example design rule relates to pattern density, which may restrict the density of a resulting resist pattern to be within a particular range.

It is therefore proposed to monitor focus using at least a first target and a second target which have been formed with a best focus offset df between the two targets. As before, the focus response with a measurement value for a target parameter (for example CD or other measurements as will be described below) takes the form of a Bossung curve for each of the first and second targets. Focus is a function of a first measurement value of a target parameter obtained from measurement of the first target and a second measurement value of a target parameter obtained from measurement of the second target. Therefore, it is proposed that measured values of a parameter from the first and second targets be obtained and a value for focus derived from these measured values. A specific example of how focus may be derived is described below, with reference to FIG. 7. However, the skilled person will realise that there are many alternative methods that allow focus to be extracted from the measured values obtained from the first and second targets. While the description below specifically discusses using a difference of the two measurement values (whether they be intensity values or otherwise), other mathematical operations and methods may be used to extract a focus value. For example, it is possible to divide one of the measurement values (from one of the first and second targets) into the other measurement value (from the other of the first and second targets).

Figure 7A:
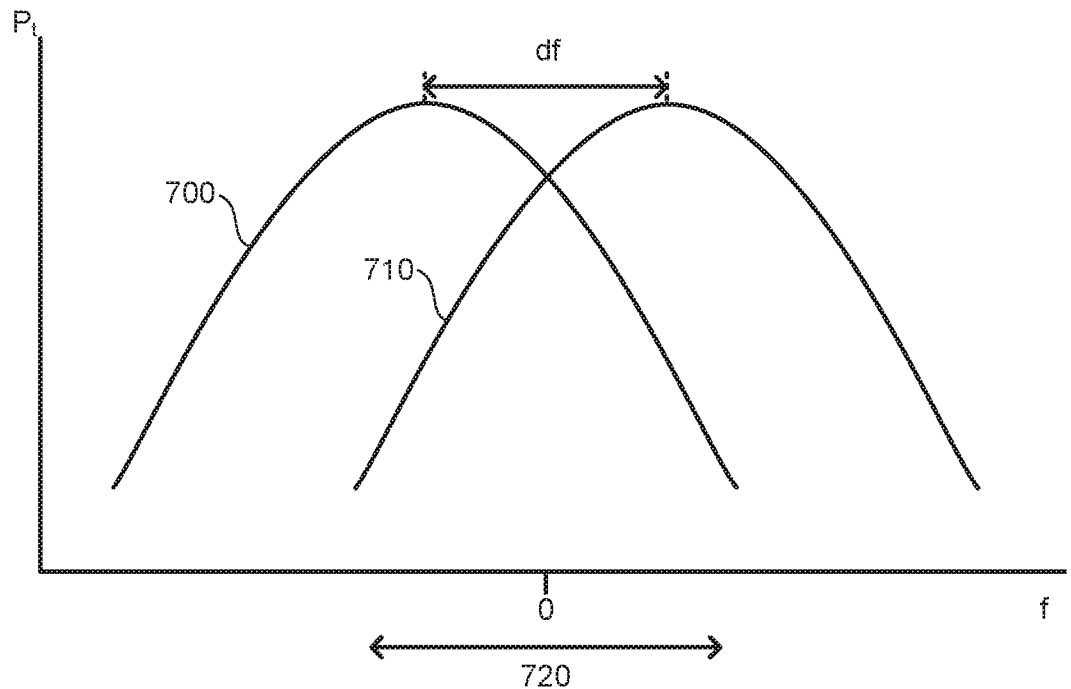
FIGS. 7(a) to 7(b) shows (a) a plot of a measured value for a target parameter (y-axis) against focus for two targets having a relative best focus offset; and (b) a plot of the difference between measured values for a target parameter from a first target and a second target (y-axis) against focus (x-axis)
Figure 7B:
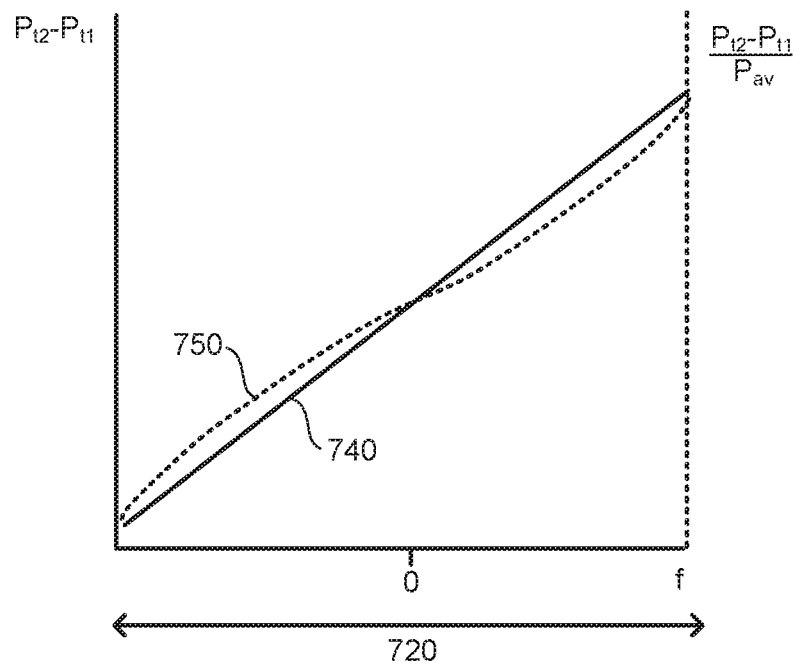

FIG. 7(a) shows a plot of a target parameter Pt against focus f for both the first target and second target. It shows a first Bossung curve 700 corresponding to the first target and a second Bossung curve 710 corresponding to the second target. Also shown is the best focus offset df (the focus offset between the two peaks of Bossung curves 700, 710). Where the targets overlap 720 is the focus range through which a difference of the target parameter for the first target and the target parameter for the second target has an essentially linear relationship with focus. This is illustrated in FIG. 7(b), which is a plot of this difference Pt2−Pt1 (where Pt1 is the target parameter for the first target and Pt2 is the target parameter for the second target) against focus. As can be seen, the relationship 740 is linear. The Pt2−Pt1 metric may be sensitive to crosstalk, e.g. by dose and/or process. A more robust metric may be Pt2−Pt1/PtAV, where PtAV, is the average of Pt2 and Pt1. The relationship 750 (dotted) of Pt2−Pt1/PtAV with focus is also shown in FIG. 7(b). This relationship is still sufficiently linear while being more robust against crosstalk.

In the specific example illustrated, the slope of relationship 740 or relationship 750 can be described by 2*df*a where df is the best focus offset and a is the Bossung curvature. Accordingly, focus can be obtained from the following equation (Equation 1):

$$f = \frac{P_{t2} - P_{t1}}{2 \cdot df \cdot a \cdot P_{tAV}}$$

where $P_{tAV}$ in the denominator is optional.

To increase focus sensitivity, it is possible to increase the best focus offset, thereby increasing the slope of relationship 740 or relationship 750.

In the above discussion, it should be appreciated that any target parameter Pt can be used provided it has a Bossung curve response with focus. While CD may be used, a new diffraction based focus methodology, is proposed which has significant advantages over prior methods. This method comprises using intensity signals obtained from diffraction orders of radiation scattered by the first target and second target to determine focus. In particular, it is proposed to use intensity values of a single diffraction order from each of the first and second targets to determine focus. The proposed method may use intensity values from corresponding diffraction orders of the first and second targets. For example, the intensity values could be that of the +1st (or −1st) diffraction orders from the first and second targets. Alternatively, or in combination, the intensity values could be that of the zeroth diffraction orders from the first and second targets.

In a specific example of such a method, it is proposed to use the difference dI in the measured intensity of a diffraction order of radiation scattered by the first target and the measured intensity of the corresponding diffraction order of radiation scattered by the second target. This difference is hereafter referred to as the dI metric. However, the dI metric may be any metric derived from diffraction intensity values from the first and second targets (e.g., by dividing one of the intensity values into the other).

In an embodiment, the dI metric may be the difference in corresponding first diffraction orders (or higher diffraction orders), e.g., the +1st diffraction order of radiation scattered by the first target and the +1st diffraction order of radiation scattered by the second target (clearly minus orders could equally be used). In another embodiment, the dI metric may comprise the difference between intensity measurements of zeroth orders from the first and second targets.

As before, the dI metric may be divided by an average of the intensity measurements Iav, to reduce the effect of crosstalk. However, the Bossung curvature for the dI metric is only weakly dependent on dose, such that the dI metric may already exhibit a sufficiently low dose crosstalk.

Using the dI metric in this way provides good signal strength and signal-to-noise response, even when the targets comprise shallow gratings (e.g., for use in EUV lithography).

As mentioned above, the dI metric may comprise the difference of the zeroth orders of radiation scattered by the first and second targets. In this way, targets with smaller pitches can be used. Consequently, target pitch for the first and second targets can be chosen to agree with any customer design rules. Also, smaller target pitches means that the overall target size can be reduced. Multiple pitches are also possible. Using the zeroth order radiation means that the diffracted radiation does not need to be captured, and the dI metric describes differences in light absorbed by targets having a relative best focus offset. Measurement of zeroth orders may also increase signal strength and signal-noise characteristics.

Where first order diffracted radiation is used, and since only a single first order is required per measurement, the pitch required to use first order radiation light is reduced to λ/2 (where λ is the detection wavelength) in the limit of numerical aperture NA=1. At present this limit is λ. This will mean that the linear target dimension can be reduced by a factor of 2 and the real estate by a factor of 4.

The best focus offset between the first target and second target can be introduced in a number of ways. In one embodiment, the lithographic apparatus used to print the targets may have a deliberate, controlled astigmatism. The astigmatism may be introduced to the projection optics via a number of manipulators included within the projection optics. The projection lenses in many lithographic apparatuses enable a sufficiently large astigmatism offset to create a best focus offset, without unwanted wavefront effects. In an embodiment, the astigmatism may introduce a best focus offset between horizontal and vertical features. To exploit this, the first and second targets may comprise respectively a horizontal grating and a vertical grating (or vice versa).

In an embodiment, the best focus offset can be introduced by the reticle (also referred to as a patterning device or mask). It is proposed to have pairs of targets (e.g., line-space gratings) incorporated on a reticle. The reticle may contain locations approximately the size of a target (for example 20×20 μm, 8×8 μm or 5×5 μm) and a border zone where the substrate is etched to a depth d. One of the first and second targets pair is deposited at normal mask level, the other at a (preferably adjacent) etched position.

FIG. 8 illustrates a number of alternative reticle arrangements for achieving such an arrangement. FIG. 8a shows, in cross section, a reference target which may be used to print one of said first target and said second target. This is a conventional target feature on a reticle, comprising radiation blocking structures 800 on a transparent reticle substrate 810. The reticle may be of any structure or material. For example, the transparent reticle substrate 810 may comprise quartz glass, and the radiation blocking structures 800 may comprise chromium, molybdenum silicide (any opacity) or tantalum boron nitride.

Figure 8A:
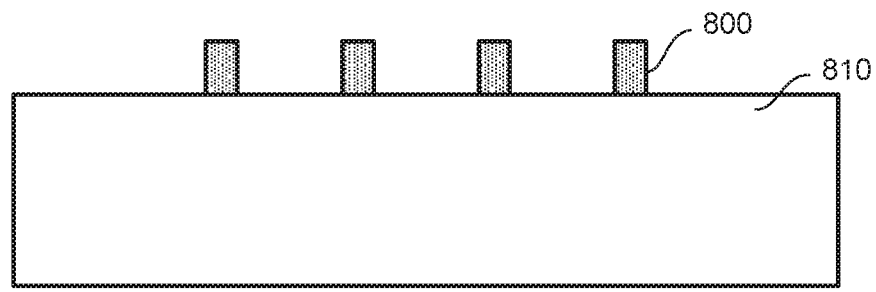
FIGS. 8(a) to 8(d) show schematically, in cross section, possible target forming designs on a reticle.
Figure 8B:
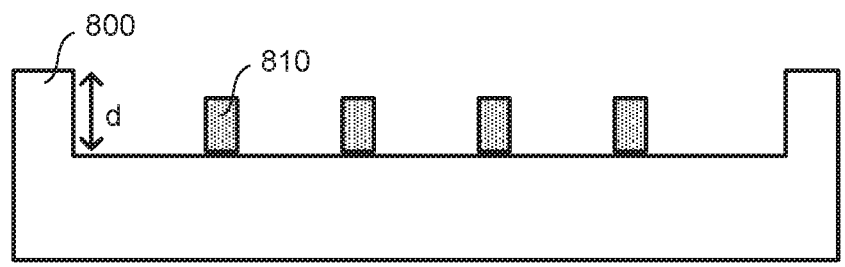
Figure 8C:
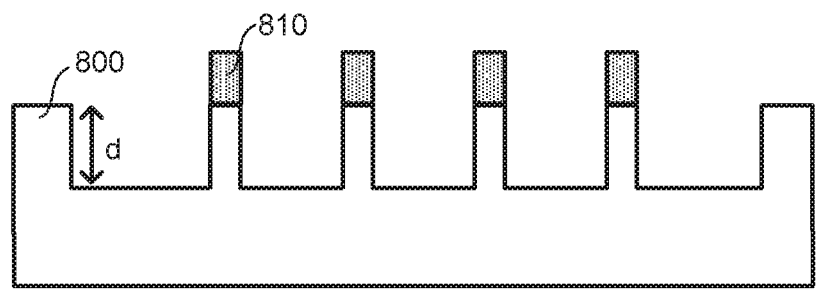
Figure 8D:
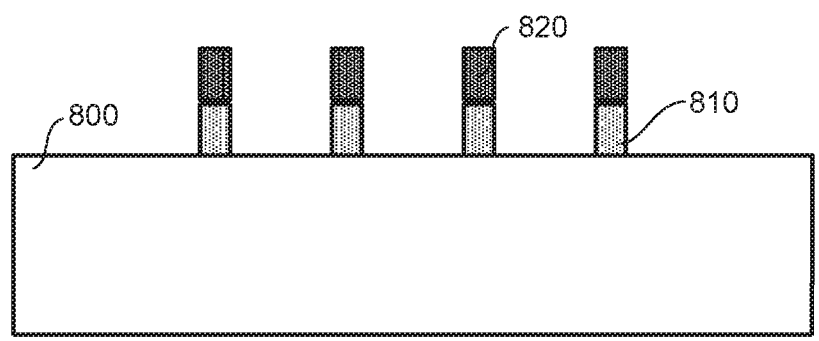

It is proposed that this reference target is used with one of the target arrangements of FIG. 8(b), 8(c) or 8(d). However, any combination of two (or more) of any of the targets shown in FIG. 8 may be used provided they result in a relative best focus offset.

FIG. 8(b) shows a transparent reticle substrate 810 which, in the region of the target, has been etched to a depth d before the addition of radiation blocking structures 800. Such an arrangement provides a simple target, but manufacture is complicated by not being able to do this in the "mask shop". FIG. 8(c) shows an arrangement similar to that of FIG. 8(a), but where the reticle substrate 810 has been etched through to a depth d after deposition of the radiation blocking structures 800. FIG. 8(d) shows an arrangement where the radiation blocking structures 800 are topped with additional metal (e.g., chromium) caps 820. This is similar to a TIS (transmission image sensor) target. Such an arrangement is not possible in EUV lithography.

In the etched examples above, the depth d may be for example 0.1 µm or more, more specifically in the region of 0.1 µm to 5 µm, or 0.5 µm to 5 µm, and for example 0.5 µm to 3 µm. In an embodiment, depth d may be in the region of 1 µm.

FIG. 9 illustrates a further reticle arrangement for achieving a best focus offset in a first (reference) target. This arrangement is suited (by way of example) for OMOG (Opaque MoSi on Glass) and for attPSM (attenuated phase-shifting mask) reticle types. In particular, the trend for attPSM reticles is for a reduction in the Cr thickness. This will reduce the Cr topping effect of FIG. 8(d) embodiment described above. The reticle production comprises depositing one (or more) extra absorber stacks are on the blank; where the blank comprises the reticle substrate on which is deposited a single absorber stack. The absorber stack may comprise an opaque layer (e.g., a MoSi layer) topped with a metal layer (e.g., a Cr layer).

Figure 9A:
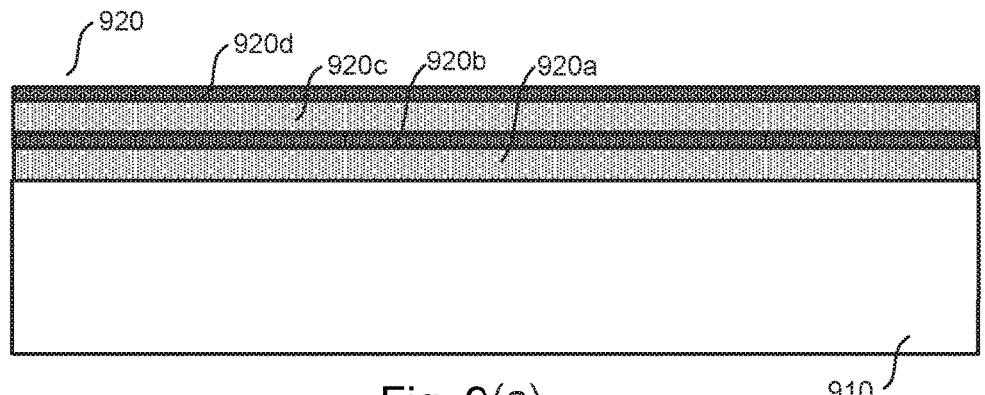
FIGS. 9(a) to 9(b) shows schematically, in cross section, (a) a reticle blank according to an embodiment and (b) a further possible target forming design on a reticle.

FIG. 9(a) shows the new reticle blank. It comprises a reticle substrate 910 topped with two absorber stacks. A first absorber stack comprises first layer 920a (e.g., a MoSi layer) and second layer 920b (e.g., a Cr layer). The second absorber layer also comprises two layers: third layer 920c (e.g., a MoSi layer) and fourth layer 920d (e.g., a Cr layer).

Figure 9B:
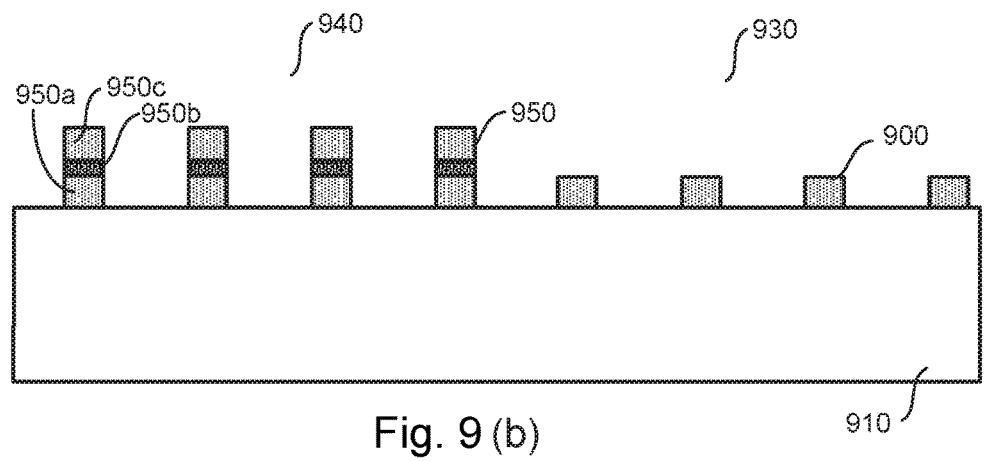

FIG. 9(b) shows the final reticle arrangement. It shows first target 930 and second target 940. First target 930 is conventional in that it comprises a single opaque layer (e.g. formed from first layer material 920a) of blocking structures 900. The second target 940 comprises blocking structures 950, each having three layers: a first layer 950a, a second layer 950b and a third layer 950c, formed respectively from first layer material 920a, second layer material 920b and third layer material 920c. The fourth layer 920d is removed completely.

The process for producing such a reticle may comprise the following steps:

Deposit one or more extra absorber stacks on the blank (this may be performed by the provider of the blank);

Etch the target layer (containing the targets 930, 940) through both stacks to the depth of substrate 910.

Remove the extra stack for the first target and its corresponding layer. This layer contains the product and the reference targets (the first targets), but not the second targets. Resist covers the second targets during this step;

Etch the reference layer in a conventional manner. Resist covers the second targets during this step A further method for obtaining two targets with a best focus offset between them comprises providing a first target comprising a line-space target with a focus insensitive side wall angle (SWA), such that the SWA of the individual structures of the first target is focus insensitive, and a second target with focus sensitive SWA. The second target may comprise a segmented line, the segmentation being sub-resolution with respect to the lithography apparatus.

Figure 10:
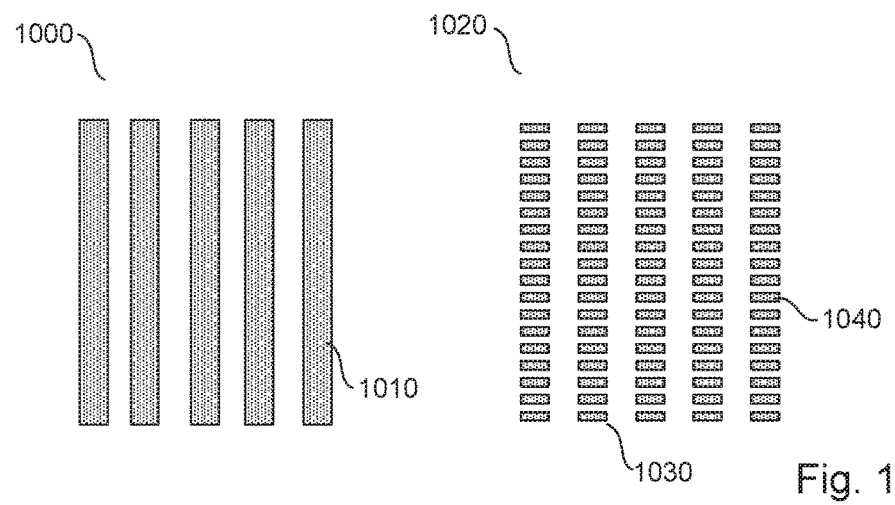
FIG. 10 show schematically, in plan view, yet further possible target forming designs on a reticle.

FIG. 10 illustrates a reticle arrangement for producing such first and second targets. The first target 1000 (shown in part) comprises a line-space target having structures 1010 which produce corresponding target structures on a substrate with an SWA that is focus insensitive. In an embodiment, the SWA is small (i.e., close to vertical). The second target 1020 (shown in part) comprises a line-space target having segmented line structures 1030. The segmented line structures 1030 comprise high resolution substructures 1040, which may be similar to high resolution substructures 625 of FIG. 6. The second target 1020 is such that the resulting target exposed on a substrate has a focus dependent SWA.

The first target 1000 and second target 1020 each have a target parameter response with focus which describe Bossung curves having a best focus offset, similar to the response illustrated in FIG. 7. This best focus offset is as a result of the focus dependent SWA of only one of the targets. SWA varies linearly with focus, which causes the shift in the Bossung peak. By this method, an asymmetric target (such as that illustrated in FIG. 6) can be separated into two separate symmetric targets having similar performance. This enables more efficient target selection and the use of the full pitch for parameter values.

An advantage of introducing the best focus offset in the reticle (rather than via astigmatism in the projection optics) is this allows both on-product and off-product focus monitoring. The requirement of astigmatism in the projection optics means that such methods can only be used for off-product monitoring.

Figure 11:
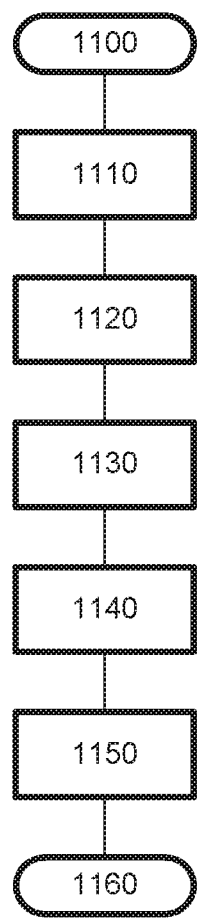
FIG. 11 is a flowchart of a method of monitoring focus according to an embodiment of the invention.

FIG. 11 is a flowchart of the steps of a method for monitoring a focus parameter during a lithographic process according to an exemplary embodiment. The steps are as follows, and are then described in greater detail thereafter:

1100—Start.

1110—Print first and second targets with a relative best focus offset;

1120—Perform first measurement from inspection of the first target to obtain first measurement value;

1130—Perform second measurement from inspection of second target to obtain second measurement value;

1140—Calculate focus from difference of first measurement value and second measurement value;

1150—Use calculated focus measurement in focus setting for subsequent exposures.

1160—End.

At step 1110, first and second targets (at least) are printed with a relative best focus offset as already described. The relative best focus offset may be introduced, for example, via a relative depth offset on the reticle between the target forming structures which form the first and second targets. Alternatively, relative best focus offset may be introduced via astigmatism in the projection optics of the lithographic system. By way of a further alternative example, the reticle arrangement illustrated in FIG. 10 may be used. Other methods of introducing a relative best focus offset between two targets are also possible and are envisaged within the scope of this disclosure.

At step 1120, a first measurement is performed from inspection of the first target to obtain a first measurement value for a target parameter. In an embodiment, this first measurement may be of the intensity (or related parameter) of one of the diffraction orders of radiation scattered by the first target. This first measurement may be obtained using any of the scatterometer devices described herein, for example. It is also contemplated within the scope of this disclosure that the first measurement be a CD measurement (whether obtained using a scatterometer, scanning electron microscope or other suitable device) or any other measurement of a parameter which has a Bossung curve relationship with focus.

At step 1130, a second measurement is performed from inspection of the second target to obtain a second measurement value for a target parameter. This second measurement should be performed using the same method as the first measurement. Where the first measurement is of the intensity (or related parameter) of one of the diffraction orders of radiation scattered by the first target, the second measurement should be of the same diffraction order of radiation scattered by the second target. The diffraction order may be either of the first diffraction orders or the zeroth diffraction order. However, higher diffraction orders can also be used and are within the scope of the disclosure. Further measurements may be made if there are more than two targets printed. These additional targets may each comprise best focus offsets that are different to that of said first target and/or said second target.

It should be appreciated that step 1120 and step 1130 may be performed as a single step such that the first measurement value and second measurement value are obtained in a single acquisition. In addition, where there are more than two targets being measured, all the targets may be measured in a single acquisition to obtain a corresponding number of measurement values. In a specific example, a measurement device, such as that illustrated in FIG. 5, can be used to measure a composite target comprising multiple individual targets (individual periodic structures or gratings). The gratings of the composite target may be positioned closely together so that they will all be within an image field or measurement spot formed by the illumination beam of the metrology apparatus. In this way, the gratings can be all simultaneously illuminated and simultaneously imaged on the detector. These images can then be processed to identify the separate images of the gratings. This can be done by pattern matching techniques, so that the images do not have to be aligned very precisely at a specific location within the sensor frame. Once the separate images of the gratings have been identified, the intensities of those individual images can be measured, e.g., by averaging or summing selected pixel intensity values within the identified areas. In another embodiment, the first and second targets may be comprised within a composite target, but measured separately in two separate acquisitions.

At step 1140, the focus is calculated from the first and second measurement values, for example from the difference of the first and second measurement values. This calculation can be performed using Equation 1 or other suitable equation or method.

At step 1150, the calculated focus can then be used in focus parameter monitoring during subsequent lithographic processes, so as to maintain focus accuracy and consistency during exposure.

The above discussion describes methods for determining focus. However, also disclosed is a method for measurement of dose. Current diffraction based dose metrology is based on simulation of the diffraction pattern of a parametrized resist pattern. The parameters are then adjusted so that the resulting zero order diffraction efficiency, notably its angular dependency, agrees with measurements. Line/space (LS) targets with CD and pitch in a range of interest are used. This method is referred to as CD reconstruction (CDR), and depends on the correctness of the parametrized model. The model is necessarily a schematic approximation to the resist pattern with a limited number of parameters. The model requires knowledge of the geometry and optical parameters of the stack. This is commonly proprietary information and therefore difficult to obtain, and may be inaccurate.

Figure 12:
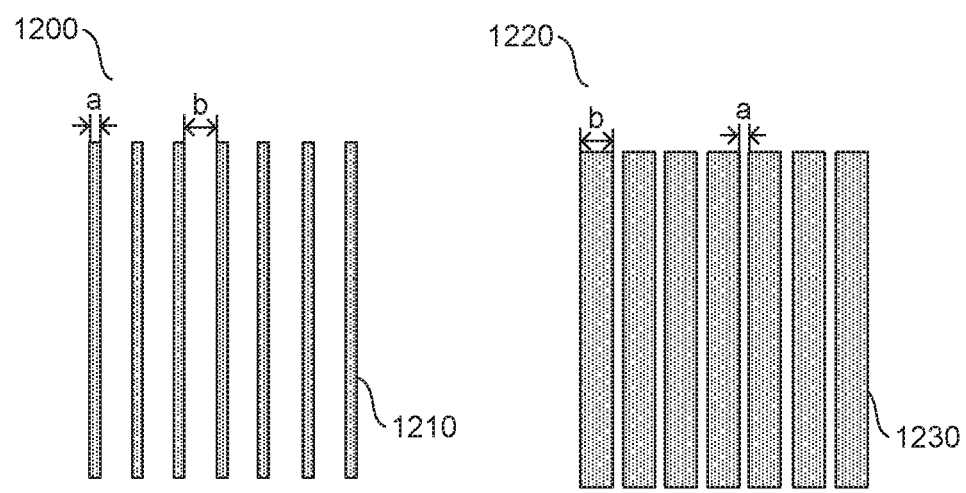
FIG. 12 show schematically, in plan view, possible target forming designs on a reticle for performing dose measurements

Therefore, a simpler method for determining dose is proposed, which comprises forming a first line-space target and a second line-space target having resist patterns with inverse duty cycles, or in pairs of resist patterns with matched properties such that cross talk, both offset and scaling, is minimised. In an embodiment, the first and second targets each have the same pitch but, where the first target is a line target, the second target will be a corresponding space target, such that the width of the lines of the first target is equal to the width of the spaces of the second target. FIG. 12 illustrates such a target arrangement having a first target 1200 with individual resist features 1210 having a CD a, and a second target 1220 with individual resist features 1230 having a CD b, each target having the same pitch.

Figure 13:
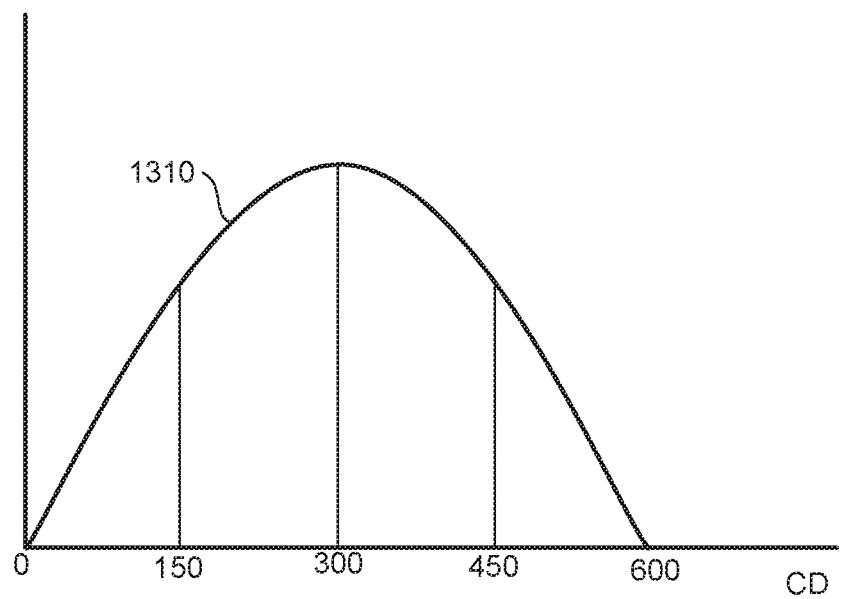
FIG. 13 shows a plot of measured intensity (y-axis) against CD (x-axis) for targets such as those illustrated in FIG. 12.
Figure 14A:
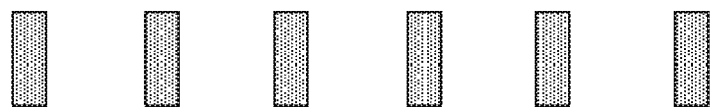
FIGS. 14(a) to 14(f) each show an example of a possible target feature forming design when constrained by an exemplary grid-based design rule.
Figure 14B:
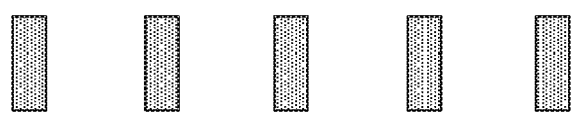
Figure 14C:
Figure 14D:
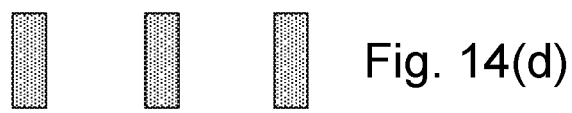
Figure 14E:
Figure 14F:

FIG. 13 shows a graph 1310 of Resist (line) CD against first order intensity I for a line space target of pitch 600 nm. It can be seen that the measured intensity for corresponding line and space targets (e.g., a first target with resist CD of 150 nm and a second target with resist CD of 450 nm) should be approximately the same. However resist CD is dependent on dose, such that an increase in dose results in a decrease in resist CD and vice versa. Consequently, an increase in dose (for example), will cause a decrease in resist CD for both the first target and second target. This will cause a decrease in the first order intensity for the first target and an increase in the first order intensity for the second target. The dose sensitivity for the first and second targets can therefore be seen to be opposite. The difference of the intensity measurements for the first and second targets can therefore be a target parameter used as a dose metric.

It can be noted that any process variation, to a certain extent, may have the same effect as dose variation. Process variations such as post exposure bake (PEB) and secondary electron blur (SEB) variation, as well as bottom anti-reflective coating (BARC) and resist thickness variation, alter the exposure intensity in the thin resist film. However, BARC and resist thickness variation affect the measured diffraction intensity: thicker BARC and resist results in an increase in the measured first order intensity. This effect does not depend on CD and the resulting intensity change is equal for both targets. If the targets have a matching nominal first order intensity response, then any crosstalk induced signal offset will cancel when taking the difference of measurements from the two targets. Any crosstalk induced scaling will be equal for the signal difference and the signal average. Therefore it is expected that the ratio of difference and average measured intensities will be robust against process crosstalk, but sensitive to dose including process induced dose effects.

It is proposed to measure dose calibration curves as a function of focus. The actual dose can be inferred from the dose calibration, assuming that focus is known. Focus can be determined using any of the methods disclosed herein, by earlier diffraction based focus methods (e.g., using structures of a form shown in FIG. 6), or any other suitable method.

While the first and second targets are described as line-space targets, they can comprise any dose dependent resist targets which produce suitable first order responses. In an embodiment, a correction may be determined to account for any difference in response to process induced dose effects between the target and product.

The proposed method enables first order intensity measurements to be used to determine dose without the need for model simulation or prediction. The method suppresses sensitivity to process variations on the target performance. The impact of illumination and dose conditions on target performance is small. The method is sensitive to scanner dose and dose-like process effects. The use of first order signals are more accurate than using zeroth order signals as they have better shot noise performance.

The targets are described above as line-space grating targets, as these are simple to produce and measure. However, the targets may comprise any structure which results in a Bossung curve response between a measurable target parameter and focus. For example, the targets may comprise combined horizontal and vertical line-space gratings, forming a "contact hole" arrangement. Such a target may enable more diffraction orders to be captured. The target arrangements may comprise more than two targets. Consequently, the methods described herein may comprise performing measurements on more than two targets.

In some circumstances, design rules are imposed which result in constraints on certain parameters of reticle features. An example of such design rules are the provision of design grids which have (and therefore impose on the target) a fixed pitch and/or CD for a line-space target. It may be that many of the targets described herein would infringe such design rules.

By way of specific example, a design grid based design rule may impose a target pitch of 100 nm and a CD of 40 nm; that is lines can only be formed with a CD of 40 nm and on a grid having a 100 nm pitch in the direction of the line-space grating. However, it may be desirable that a target actually has a pitch of 600 nm, such that first order signals can be detected and measured. It is proposed that such a line-type target can be obtained by providing 1 or 2 such lines on corresponding grid locations in a row of such grids. Each grid therefore will define a single target feature. An analogous space-type target can be obtained by providing 4 or 5 such lines on corresponding grid locations in a row of such grids.

It is desirable to image these patterns such that they have the designed dimensions and a sufficiently large depth of focus on the substrate. Therefore, the lines may be biased (e.g., in a manner similar to optical proximity correction methods) and (for example 20 nm) assist features may optionally be placed on the empty locations on each grid. In this way, the target may be made more stable and more symmetrical (e.g., in terms of SWA).

FIGS. 14(a) to 14(f) each comprise an example of possible target features based upon a grid. In particular, where the CD is 40 nm and grid pitch 100 nm as per the example previously given, the 2 line example of FIG. 14(e) and 4 line example of FIG. 14(c) emulate target features for respectively line and space targets having a CD of about 100-150 nm and pitch of 600 nm.

A method of manufacturing devices using the lithographic process can be improved by providing an inspection apparatus as disclosed herein, using it to measure processed substrates to measure parameters of performance of the lithographic process, and adjusting parameters of the process (particularly focus) to improve or maintain performance of the lithographic process for the processing of subsequent substrates.

It should be understood that the particular parameters used in the above examples are not the only ones that may be defined. Additional and/or alternative parameters can be used in a real design process, according to limitations of the lithographic apparatus and the inspection apparatus to be used for the metrology. While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of designing metrology recipes and/or controlling the inspection apparatus to implement the illumination modes and other aspects of those metrology recipes. This computer program may be executed for example in a separate computer system employed for the design/control process. Alternatively, the design process may be wholly or partly performed within unit PU in the apparatus of FIG. 3, 4 or 5 and/or the control unit LACU of FIG. 2. There may also be provided a data storage medium (e.g., semiconductor memory, magnetic or optical disk) having such a computer program stored therein.

Further embodiments according to the invention are provided in below numbered clauses:

1. A method of monitoring a focus parameter during a lithographic process, said method comprising:
   acquiring a first measurement value, said first measurement value having been obtained from inspection of a first target;
   acquiring a second measurement value, said second measurement value having been obtained from inspection of a second target,
   wherein said first target and second target have been exposed with a relative best focus offset;
   determining the focus parameter from said first measurement value and said second measurement value.

2. A method according to clause 1 wherein said first measurement value has been obtained from a first measurement of radiation scattered from said first target and said second measurement value has been obtained from a second measurement of radiation scattered from said second target.

3. A method according to clause 2 wherein said first measurement is an intensity measurement of a diffraction order of radiation scattered from said first target and said second measurement is an intensity measurement of a corresponding diffraction order of radiation scattered from said second target.

4. A method according to clause 3 wherein said diffraction order is the zeroth diffraction order.

5. A method according to clause 3 wherein said diffraction order is a non-zeroth diffraction order.

6. A method according to any preceding clause comprising the steps of performing said first measurement to obtain said first measurement value and performing said second measurement to obtain said second measurement value.

7. A method according to any of clauses 1 to 5 comprising inspecting at least said first target and said second target in a single measurement to obtain said first measurement value and said second measurement value.

8. A method according to any preceding clause wherein said step of determining the focus parameter comprises determining the focus parameter from the difference of said first measurement value and said second measurement value.
9. A method according to clause 8 wherein said difference of said first measurement value and said second measurement value is divided by an average of said first measurement value and said second measurement value.
10. A method according to clause 8 or 9 wherein the variation of said first measurement value with focus and the variation of said second measurement value with focus each define corresponding Bossung curves having a relative focus offset, and the variation of said difference of said first measurement value and said second measurement value with focus is substantially linear.
11. A method according to clause 10 wherein the variation of said difference of said first measurement value and said second measurement value with focus is defined by a line having a slope dependent upon the curvature of said Bossung curves and the relative best focus offset.
12. A method according to any preceding clause wherein the relative best focus offset results from astigmatism in the lithographic apparatus during formation of said first target and second target.
13. A method according to clause 12 wherein said astigmatism results in a relative best focus offset between horizontal and vertical structures, and wherein said first target comprises substantially horizontal structures and said second target comprises substantially vertical structures.
14. A method according to any of clauses 1 to 12 wherein the relative best focus offset is resultant from the patterning device which defines said first target and second target.
15. A method according to clause 14 wherein there is an offset in the depth of the patterns in said patterning device which define said first target and second target.
16. A method according to clause 14 or 15 wherein one of the patterns for defining one said first target or said second target comprises line features which are taller, in a direction transverse to the plane of the target when compared to the other of said first target or said second target.
17. A method according to clause 16, having at least one additional layer of absorber material.
18. A method according to clause 17 wherein the additional layer comprises one of: a metal, molybdenum silicide or tantalum boron nitride.
19. A method according to clause 17 wherein the additional layer comprises an additional stack of absorber material.
20. A method according to clause 14 wherein said first target comprises line features having a substantially focus independent side wall angle and said second target comprises line features having a focus dependent side wall angle.
21. A method according to clause 20 wherein each of said first target and said second target comprise line-space grating structures, and wherein the pattern on the patterning device which defines said second targets comprise segmented line features, each segmented line feature having a pitch below the imaging resolution of the lithographic process.
22. A method according to any preceding clause comprising forming said first target and said second target on a substrate with said relative best focus offset.
23. A method according to any preceding clause wherein said first target and said second target each comprise line-space grating structures.
24. A method according to any preceding clauses wherein design rules constrain target features to a set critical dimension and on a grid of set pitch, wherein said first target and said second target are each formed from rows of said grids such that each line feature of said first target and said second target are formed from one, or plural adjacent, corresponding target features formed on said grids.
25. A method according to any preceding clause wherein patterns defining said first target and said second target do not comprise features which purposely introduce focus dependent asymmetry in said first target and said second target.
26. A method according to any preceding clause comprising:
making additional measurements of additional targets, said additional targets being additional to said first target and said second target, each of said additional targets having a different best focus to that of said first target and/or said second target; and
using said additional measurements in said step of determining the focus parameter.
27. A method of monitoring a dose parameter during a lithographic process, said method comprising:
acquiring a first measurement value, said first measurement value having been obtained from inspection of a first target;
acquiring a second measurement value, said second measurement value having been obtained from inspection of a second target,
determining the dose parameter from said first measurement value and said second measurement value;
wherein said first and second targets comprise corresponding line and space targets having the same pitch and inverse duty cycles.
28. A method according to clause 26 or 27 wherein said step of determining the dose parameter comprises determining the dose parameter from the difference of said first measurement value and said second measurement value.
29. A method according to any of clauses 26 to 28 wherein said step of determining the dose parameter comprises:
determining a focus parameter of said lithographic process; and
referring to a dose calibration curve corresponding to said determined focus parameter.
30. A method according to clause 29 wherein said step of determining the dose parameter comprises performing the method of any of clauses 1 to 26.
31. A metrology apparatus for measuring a parameter of a lithographic process, the metrology apparatus being operable to perform the method of any of clauses 1 to 30.
32. A metrology apparatus according to clause 31 comprising:
a support for said substrate having a plurality of targets thereon;
an optical system for measuring each target; and
a processor.

33. A lithographic system comprising:
a lithographic apparatus comprising:
an illumination optical system arranged to illuminate a pattern;
a projection optical system arranged to project an image of the pattern onto a substrate; and
a metrology apparatus according to clause 31 or 32,
wherein the lithographic apparatus is arranged to use the determined focus parameter and/or dose parameter calculated by the metrology apparatus in applying the pattern to further substrates.

34. A computer program comprising processor readable instructions which, when run on suitable processor controlled apparatus, cause the processor controlled apparatus to perform the method of any one of clauses 1 to 26.

35. A computer program carrier comprising the computer program of clause 34.

36. A method of manufacturing devices wherein a device pattern is applied to a series of substrates using a lithographic process, the method including:
using the method of any of clauses 1 to 26 to monitor said focus parameter, and
controlling the lithographic process for later substrates in accordance with the determined focus parameter.

37. A method of manufacturing devices wherein a device pattern is applied to a series of substrates using a lithographic process, the method including:
using the method of any of clauses 27 to 30 to monitor said dose parameter, and
controlling the lithographic process for later substrates in accordance with the determined dose parameter.

38. A patterning device configured to pattern a beam of radiation in a lithographic process according to a desired pattern, said patterning device comprising first features for forming a first target on a substrate during the lithographic process, and second features for forming a second target on the substrate during the lithographic process; wherein said second features are taller than said first features, in a direction transverse to the plane of the target and such that said first target and said second target have a relative best focus offset.

39. A patterning device according to clause 38 wherein said first features and second features are deposited on a reticle substrate and said second features are deposited on a section of the reticle substrate which has been etched to a different level, in a direction transverse to the plane of the target, compared to a section of the reticle substrate on which said first features have been deposited.

40. A patterning device according to clause 38 or 39 wherein said second features comprise one or more additional layers than said first features.

41. A patterning device according to clause 40 wherein the one or more additional layers comprises a layer of absorber material.

42. A patterning device according to clause 41 wherein the additional layer of absorber material comprises one of: a metal, molybdenum silicide or tantalum boron nitride.

43. A patterning device according to clause 40 wherein the one or more additional layers comprises an additional stack of absorber material, said additional stack of absorber material comprising a first layer of absorber material and a second layer of absorber material.

44. A patterning device according to clause 43 wherein the first layer of absorber material comprises molybdenum silicide or tantalum boron nitride, and said second layer of absorber material comprises a metal.

45. A patterning device configured to pattern a beam of radiation in a lithographic process according to a desired pattern, said patterning device comprising first features for forming a first target on a substrate during the lithographic process, and second features for forming a second target on the substrate during the lithographic process; wherein said first features are configured to form said first target with line features having a substantially focus independent side wall angle and said second features are configured to form said second target with line features having a focus dependent side wall angle.

46. A patterning device according to clause 45 wherein each of said first target and said second target comprise line-space grating structures, and wherein the second features comprise segmented line features, each segmented line feature having a pitch below the imaging resolution of the lithographic process.

47. A patterning device configured to pattern a beam of radiation in a lithographic process according to a desired pattern, said patterning device comprising first features for forming a first target on a substrate during the lithographic process, and second features for forming a second target on a substrate during the lithographic process; wherein design rules constrain target features to a set critical dimension and on a grid of set pitch, wherein said first target and said second target are each formed from rows of said grids such that each of said first features and said second features are formed from one, or plural adjacent, corresponding target features formed on said grids.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:
1. A method of monitoring a focus parameter during a lithographic process, the method comprising:

acquiring a first measurement value, the first measurement value having been obtained from inspection of a first target;

acquiring a second measurement value, the second measurement value having been obtained from inspection of a second target, wherein the first and second targets have been exposed with a relative best focus offset; and determining the focus parameter from a difference of the first and second measurement values, wherein the difference of the first and second measurement values is divided by an average of the first and second measurement values, wherein the first and second measurement values comprise intensity values of a diffraction order of radiation scattered by the first and second targets, respectively.

2. The method of claim 1, wherein the relative best focus offset results from astigmatism in the lithographic apparatus during formation of the first and second targets.

3. The method of claim 1, further comprising:
forming the first and second targets on a substrate with the relative best focus offset.

4. The method of claim 1, wherein the first and second targets each comprise line-space grating structures.

5. The method of claim 1, wherein:
design rules constrain target features to a set critical dimension, and
wherein on a grid of set pitch, the first and second targets are each formed from rows of the grid, such that each line feature of the first target and second targets are formed from one or more adjacent, corresponding target features formed on the grid.

6. The method of claim 1, wherein patterns defining the first and second targets do not comprise features which purposely introduce focus dependent asymmetry in the first and second targets.

7. The method of claim 1, further comprising:
acquiring additional measurements of additional targets, the additional targets being additional to the first and second targets, and each of the additional targets having a different best focus to that of the first target and/or the second target; and
using the additional measurements in the step of determining the focus parameter.

8. The method of claim 1, wherein the diffraction order comprises a first diffraction order of radiation scattered from the first and second targets.

9. The method of claim 1, wherein the diffraction order comprises a zeroth diffraction order of radiation from the first and second targets.

10. The method of claim 1, wherein the first and second targets comprise corresponding line and space targets having the same pitch and inverse duty cycles.

11. A method of monitoring a dose parameter during a lithographic process, the method comprising:
acquiring a first measurement value, the first measurement value having been obtained from inspection of a first target;
acquiring a second measurement value, the second measurement value having been obtained from inspection of a second target, and
determining the dose parameter from the first and second measurement values;
wherein the first and second targets comprise corresponding line and space targets having the same pitch and inverse duty cycles.

12. The method of claim 11, wherein the step of determining the dose parameter comprises:
determining the dose parameter from a difference of the first and second measurement values.

13. The method of claim 11, wherein the step of determining the dose parameter comprises:
determining a focus parameter of the lithographic process; and
referring to a dose calibration curve corresponding to the determined focus parameter.

14. The method of claim 13, further comprising:
determining the focus parameter from the first and second measurement values,
wherein the first and second targets have been exposed with a relative best focus offset.

15. A lithographic system comprising:
a lithographic apparatus comprising:
an illumination optical system arranged to illuminate a pattern; and
a projection optical system arranged to project an image of the pattern onto a substrate; and
a metrology apparatus comprising:
a support for the substrate having a plurality of targets thereon;
an optical system for measuring each target; and
a processor configured to:
acquire a first measurement value, the first measurement value having been obtained from inspection of a first target;
acquire a second measurement value, the second measurement value having been obtained from inspection of a second target, wherein the first and second targets have been exposed with a relative best focus offset; and
determine the focus parameter from a difference of the first and second measurement values, wherein the difference of the first and second measurement values is divided by an average of the first and second measurement values, wherein the first and second measurement values comprise intensity values of a diffraction order of radiation scattered by the first and second targets, respectively,
wherein the lithographic apparatus is arranged to use the focus parameter and/or a dose parameter calculated by the metrology apparatus in applying the pattern to further substrates.

16. A non-transitory computer program product comprising processor readable instructions which, when run on suitable processor controlled apparatus, cause the processor controlled apparatus to perform operations comprising:
acquiring a first measurement value, the first measurement value having been obtained from inspection of a first target;
acquiring a second measurement value, the second measurement value having been obtained from inspection of a second target, wherein the first and second targets have been exposed with a relative best focus offset; and
determining the focus parameter from a difference of the first and second measurement values, wherein the difference of the first and second measurement values is divided by an average of the first and second measurement values,
wherein the first and second measurement values comprise intensity values of a diffraction order of radiation scattered by the first and second targets, respectively.

17. The lithographic system of claim 15, wherein the diffraction order comprises a first diffraction order of radiation scattered from the first and second targets.

18. A method of manufacturing devices wherein a device pattern is applied to a series of substrates using a lithographic process, the method comprising:
   monitoring a focus parameter by:
      acquiring a first measurement value, the first measurement value having been obtained from inspection of a first target;
      acquiring a second measurement value, the second measurement value having been obtained from inspection of a second target, wherein the first and second targets have been exposed with a relative best focus offset; and
      determining the focus parameter from a difference of the first and the second measurement values, wherein the difference of the first and second measurement values is divided by an average of the first and second measurement values,
      wherein the first and second measurement values comprise intensity values of a diffraction order of radiation scattered by the first and second targets, respectively; and
   controlling the lithographic process for later substrates in accordance with the determined focus parameter.

19. The method of claim 18, wherein the diffraction order comprises a first diffraction order of radiation scattered from the first and second targets.

* * * * *